United States Patent [19]

Schoen, Jr. et al.

[11] Patent Number: 5,096,551

[45] Date of Patent: Mar. 17, 1992

[54] METALLIZED TUBULE-BASED ARTIFICIAL DIELECTRIC

[75] Inventors: Paul E. Schoen, Jr., Alexandria; Joel M. Schnur, Burke, both of Va.

[73] Assignee: The United States of America as represented by the Secretary of the Navy, Washington, D.C.

[21] Appl. No.: 575,749

[22] Filed: Aug. 31, 1990

[51] Int. Cl.⁵ .................. H01G 9/00; H01G 13/00
[52] U.S. Cl. .............................. 204/131; 204/165; 204/167; 204/155; 333/175; 343/911 R; 361/301
[58] Field of Search .............. 204/131, 165, 167, 155; 333/175; 343/911 R; 361/301

[56] References Cited

PUBLICATIONS

Schoen et al., Order in Diacetylenic Microstructures (1987), pp. 357–366.
Rudolph, A. S. et al., Technological Development of Lipid Based Tubule Microstructures (1988), pp. 305–320.

Primary Examiner—John Niebling
Assistant Examiner—Arun S. Phasge
Attorney, Agent, or Firm—Thomas E. McDonnell; Barry A. Edelberg

[57] ABSTRACT

Dielectric composites are produced by incorporating metallized particles having a high aspect ratio, such as metallized phospholipid tubules, in a polymeric and/or ceramic matrix and curing or sintering in an electric, magnetic, or flow field to align the particles. The resulting composites have extremely anisotropic properties and high dielectric constants. These composites can be used, for example, in EMI shielding and microwave applications.

27 Claims, 2 Drawing Sheets

METALLIZED TUBULE-BASED ARTIFICIAL DIELECTRIC

BACKGROUND OF THE INVENTION

1. Field of the Invention

The present invention relates to generally to lipid tubules and more specifically to dielectric composites containing metallized lipid tubules.

2. Description of the Prior Art

The production of lipid tubules is well known. For example, U.S. Pat. No. 4,877,501, to Schnur et al, incorporated herein by reference, teaches the production of tubular and/or helical microstructures from selected lipids and especially from lipids containing diacetylenic moieties. U.S. Pat. No. 4,911,981, also to Schnur et al and incorporated herein by reference, describes metallized microstructures produced by electroless plating of lipid tubules aided by the prior absorption of a catalytic precursor to the lipid microstructures. That patent also describes the incorporation of the metallized lipid microstructures into a polymer matrix. The thus produced composites, in which the metal-clad lipid microstructures are randomly oriented within the matrix, can provide useful electrical components such as inductors, capacitors and low loss electrical connectors, depending on the geometry of the lipid microstructure and the properties of the metal coating.

Because the metal clad lipid microstructures in the Schnur et al composites described above are randomly oriented, their properties are isotropic. Thus, the composites cannot be optimized for uses such as variable phase shifting, shielding against polarized electromagnetic energy, microwave resonating, frequency filtering, focusing, defocusing and discriminating between certain waveguide modes, which require anisotropic properties.

SUMMARY OF THE INVENTION

It is an object of the present invention to obtain metal clad tubule-containing composites having anisotropic electromagnetic properties.

It is another object of the present invention to produce electronic components having highly anisotropic properties.

It is a further object of the present invention to obtain metal clad lipid tubule-containing composites useful as electronic shielding, RC resonators for tuned circuits, electronic focusing or defocusing elements, phase shifters and the like.

These and other objects are accomplished by aligning metal clad lipid tubules contained in a prepolymer or ceramic gel in an electrical, magnetic or flow field prior to curing or sintering. The resulting product usefully interacts with magnetic and/or electrical fields in a manner determined by the metal coating on the tubules and the geometry of the pattern in which the tubules are aligned.

DETAILED DESCRIPTION OF THE PREFERRED EMBODIMENTS

Figure 2:
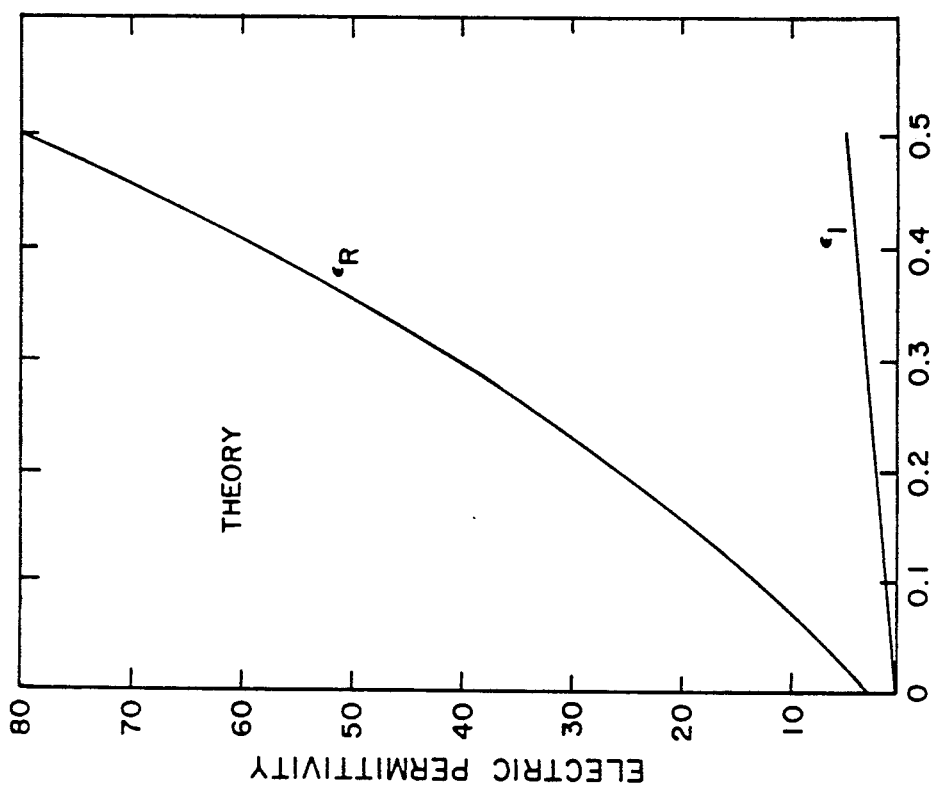
FIG. 2 shows calculated values of the real and imaginary parts of permittivity vs tubule-epoxy weight fraction. The tubule conductivity is assumed to be $7.5 \times 10^3$/ohm-meter.

The present invention is best understood by reference to the interaction of a tubule with an electric field $\overline{E}$. The external field induces a dipole moment $\overline{p}$ in the tubule which can be expressed by $$\overline{p} = \alpha \epsilon_0 \overline{E} \tag{1}$$

where $\epsilon_0$ is the permittivity of free space and $\alpha$ is the polarizability of the tubule. In general, $\alpha$ is complex, hence $$\alpha = \alpha_R + i\alpha_I. \tag{2}$$

In Eq. (2), $\alpha_R$ gives the in phase response and $\alpha_I$ give the out of phase response of the tubule to the external field. $\alpha$ depends on the field frequency and on tubule geometry, orientation and conductivity.

Similarly, in complete analogy with electric polarizability, one may define a magnetic polarizability, $\alpha_m$, which gives the induced magnetic moment of the tubule, $\overline{\mu}$, in response to an external magnetic field $\overline{B}_0$. Thus, $\overline{\mu} = \alpha_m \overline{B} \mu_0$, where $\mu_0$ is the permeability of free space. Since the theoretical treatment of the electric and magnetic fields are similar, the case of a tubule in an electric field will be considered in some detail.

To obtain the electric polarizability $\alpha$ in terms of the relevant parameters of the tubule, note that the electric polarization, $\overline{P}$, is related to the tubule dipole moment, $\overline{p}$, by the relation, $$\overline{P} = \frac{\overline{p}}{v}, \tag{3}$$

where v is the tubule metal shell volume (i.e., excluding the hollow interior volume of the tubule). Consequently, using Eq. (1) in Eq. (3), $$\overline{P} = \frac{\alpha \epsilon_0}{v} \overline{E}_0.$$

Furthermore, $\overline{P}$ is related to the local field $\overline{E}$ by the usual relation $$\overline{P} = (\kappa - 1)\epsilon_0 \overline{E} \tag{4}$$

where $\kappa$ is the complex dielectric constant of the tubule. Now, the internal field, $\overline{E}$, is the sum of the external field $\overline{E}_0$ and the depolarization field $-(L/\epsilon_0)\overline{P}$ produced by the tubule. Hence, $$\bar{E} = \bar{E}_0 - \frac{L}{\epsilon_0}\bar{P}. \quad (5)$$

where L is the depolarization factor of the tubule. Equations (4) and (5) combine to yield, $$\bar{P} = \frac{\bar{E}_0}{\frac{L}{\epsilon_0} + \frac{1}{\epsilon_0(\kappa - 1)}}. \quad (6)$$

Comparing (6) and (3), one obtains the electric polarizability of a tubule as, $$\alpha = \frac{v(\kappa - 1)}{L\kappa + (1 - L)}. \quad (7)$$

As noted before, $\alpha$ is, in general, complex. That $\alpha$ is complex results from the complex character of $\kappa$ in Eq. (7), $$\kappa = \kappa_R + i\kappa_I.$$

At microwave frequencies and lower (f<100 GHz), the displacement currents are negligible compared to the conduction currents, and therefore, $K_R << K_I$. Under this assumption, $$\kappa \approx i\kappa_I = \frac{i\sigma}{2\pi f \epsilon_0}. \quad (8)$$

where $\sigma$ is the tubule conductivity and f is the field frequency. Substituting Eq. (8) in Eq. (7) results in, $$\alpha_R = \frac{v\kappa_I^2 L}{1 - L^2\kappa_I^2}. \quad (9)$$

$$\alpha_I = \frac{v\kappa_I}{1 - L^2\kappa_I^2}. \quad (10)$$

At microwave frequencies $L^2\kappa_I^2 > 1$, Eqs. (9) and (10) then assume the forms $$\alpha_R = v/L \quad (11)$$

$$\alpha_I = v/L^2\kappa_I \quad (12)$$

Of course, the real and imaginary parts of $\alpha$ are not independent of each other. In fact, when one of them is given over the whole frequency spectrum, the other one is prescribed. In the present case, $$\alpha_R = L\kappa_I \alpha_I. \quad (13)$$

To determine $\alpha$ from equations (9) and (10), one needs to know the depolarization factor L for the tubule. For a solid cylindrical rod of length d, and radius a, the depolarization factor is given by $$L_s = \frac{6a^2}{d^2}\left[\ln\left(\frac{2d}{a}\right) - 7/3\right]. \quad (14)$$

For a cylindrical shell of thickness, $\delta a$, a case which applies to the tubules, the relation becomes, $$\delta L_s = \frac{2\delta a}{a} L_s. \quad (15)$$

With $\alpha$ determined for one tubule, several bulk parameters can be calculated for a dilute matrix of the tubules in a dielectric medium. Consider the case of a dilute dispersion of N tubules per unit volume in a medium of dielectric constant $\epsilon_m$. The tubules, though randomly dispersed, are assumed to be oriented in the same direction. In this case, the tubule loaded composite exhibits great anisotropy in its bulk dielectric constant. The dielectric properties are only slightly affected for fields perpendicular to the tubule axes. However, when the external field is parallel to the tubule axes, the dielectric response of the composite is greatly affected. In fact, in the latter case, the real and imaginary dielectric constants are given by, $$\epsilon_R = \epsilon_m + N\alpha_R, \quad (16)$$

$$\epsilon_I = N\alpha_I. \quad (17)$$

Measurements of $\epsilon$ in this specification and the claims that follow are expressed as functions of weight fraction F:

$$F = V_t \rho_t / (V_t \rho_t + (1 - V_t)\rho_e) \quad (18)$$

where $V_t$ is the total shell volume occupied by all the metal tubules, and $\rho_t$ and $\rho$ are the respective densities of the metal and the matrix epoxy. As a result, $\epsilon$ has a curved, rather than a linear, dependence on F, as seen in FIG. 2.

Simple analysis leads to other parameters of interest in terms of $\alpha$. For example, the scattering cross section S is given by $$S = k^4 |\alpha|^2 / 6\pi, \quad (19)$$

where $k = 2\pi/\lambda$ is the usual wave number and $\lambda$ is the wavelength of radiation. Similarly, the extinction cross section is given by $$\Omega = k\alpha_I. \quad (20)$$

At microwave frequencies, the scattering cross section is several orders of magnitude smaller than the extinction cross section, hence the extinction cross section is very nearly equal to the absorption cross section. However, a more useful quantity is the attenuation length D defined through the relation, $$I(x) = I_0 e^{-x/D}, \quad (21)$$

where I is the intensity of radiation at a distance x into the medium along the direction of propagation and $I_0$ is the intensity at the surface. Since the absorption plays the dominant role at microwave frequencies (scattering is negligible), the attenuation is primarily due to absorption. Therefore, A, the absorption coefficient per unit volume, is $$A = D^{-1} = N\Omega = Nk\alpha_I. \quad (22)$$

Any metallized lipid tubules of high aspect ratio can be used in the composites according to the present invention. Preferably, metallized tubules useful in the present invention have aspect ratios of greater than twenty, preferably greater than 50, and most preferably greater than 150. Generally, the metal clad tubules will have an aspect ratio of 15 to 500, more often 50 to 150, and typically about 100, inclusive of the coating thickness.

The lipid tubules useful in the present invention can be made and/or metallized by any process suitable to the production and/or metallization of lipid tubules having a high aspect ratio. These processes include, but are not limited to, the processes for producing a lipid tubule described in the Schnur et al '501 patent and the copending Schoen et al U.S. patent application Ser. Nos. 07/161,934, filed Feb. 29, 1988 (incorporated herein by reference) and 07/256,680, filed Sept. 16, 1988 (incorporated herein by reference) and the processes for making a lipid tubule and then metallizing that tubule described in Schnur '981 patent.

Any metal coating used on metal clad lipid tubules can be used as the metal coating of the metal clad lipid tubules used in the present invention. Typical metal coatings include, but are not limited to, gold, iron, copper, permalloy (alloy of Ni and Fe), nickel, cobalt and a layered alloy of gold on nickel. The coating may be ferromagnetic or not depending on the end use desired for the composite.

The matrix within which the tubules are aligned and held can be either a ceramic or a polymer such as an epoxy, a vinyl, an acrylamide or a wax. If the matrix is a ceramic, the tubules may be, for example, aligned within the ceramic matrix while the ceramic is in the sol gel state and the aligned sol gel then sintered for densification to provide a porous ceramic. If a polymer matrix is desired, the tubules may be added to the uncured polymer or polymer solution, the tubules aligned while within the uncured polymer or polymer solution, and the uncured polymer or polymer solution cured by conventional means. Depending on the rate at which the sintering or curing process occurs, the tubules can be aligned during the initial stages of the sintering or curing process, before viscosity of the matrix has increased sufficiently to prevent effective alignment.

During alignment, the viscosity of the matrix should be as little as possible, to permit alignment, but should be sufficient to maintain the metal clad lipid tubules in suspension. Typically useful viscosities for particle alignment are in the range of about the viscosity of water to about the viscosity of heavy maple syrup.

The intensity of the electromagnetic effects of the metal clad tubules increases with the load fraction of the metal clad tubules within the matrix. Because the metal clad lipid tubules are thixotropic, the loading fraction of the tubules within the matrix can also influence the matrix viscosity prior to sintering or curing. Therefore, with a polymer matrix, for example, the metal clad lipid tubules preferably constitute, depending on the end use envisioned, about 0.5 to about 50 weight percent of the combined weight of the metal clad lipid tubule and uncured polymer. The preferred loading fraction of tubules within a ceramic matrix will depend on the viscosity of the sol gel containing the matrix and any factors, such as the liquid medium and any suspending agents, which influence the same, as well as the desired end use. Because the metal clad lipid tubules are hollow, they will exert little mechanical influence on the bulk properties of the cured or sintered product.

The metal clad lipid tubules can be easily aligned, depending on the nature of the cladding, within an electrical field, a magnetic field or a flow field. While only lipid tubules with a ferromagnetic cladding can be aligned within a magnetic field, any metal clad lipid tubule can be aligned within an electrical field or a flow field.

To align lipid tubules with a ferromagnetic cladding within a magnetic field, the prepolymer (uncured polymer) or sol gel and lipid tubules are mixed and placed within a mold. The mold is held between two faces of a magnet and a magnetic field is applied between the faces to align the tubules. The mixture of aligned tubules and prepolymer or sol gel is allowed to set and the set polymer or ceramic containing the aligned tubules is released from the mold by conventional means. Typically, the magnetic field applied to align the tubules within the matrix is about 50 to 1000 Gauss, preferably about 200 to 800 Gauss, and most preferably about 450 to 650, and typically about 500 Gauss. The ferromagnetic metal clad lipid tubules will align with the magnetic field in the area corresponding to their location within the field.

To electrically align metal clad lipid tubules, the prepolymer (uncured polymer) or sol gel and lipid tubules are mixed and placed within a mold. The mold is held within an electrical field generated by any suitable means, such as between the plates of a capacitor. The metal clad lipid tubules will orient along the electric field lines in the area corresponding to their location within the field.

To align the metal clad lipid tubules by flow, the prepolymer or sol gel and lipid tubules are passed through a conduit during curing or sintering so as to generate a flow field of the desired shape. The metal clad lipid tubules will orient along the flow field lines in the area corresponding to their location within the aligning field.

By appropriately positioning the sample containing the metal clad lipid tubules relative to the aligning field, the tubules, since they align with the field where they are located, can be aligned in a geometry which will provide a final product having useful directional focusing or filtering capabilities, such as a spatially tunable lens or filter.

Of course, the better the alignment of the metal clad lipid tubules with respect to the field, the better the desired properties will be. Preferably, 90% or more of the metal clad lipid tubules will be aligned within 5° of the direction of the field at their location during alignment. More preferably, 90% or more of the metal clad lipid tubules will be aligned within 2° of the direction of the field at their location during alignment.

Having described the invention, the following examples are given to illustrate specific applications of the invention including the best mode now known to perform the invention. These specific examples are not intended to limit the scope of the invention described in this application.

EXPERIMENT

1) Specimens

Specimens were prepared by mixing permalloy coated tubules (mean length 30 mm, metal coating ~1000 Å) with epoxy (74% Epon 815 epoxy + 26% Ancamide 507B curing agent) and cast into rods and sheets using silicon rubber molds. The initial tubule-epoxy mixture was diluted by adding more epoxy to obtain lower concentrations of tubules in the medium.

The rod samples (diameter 1.5 mm and length 10 cm) were allowed to cure overnight in a magnetic field ($\approx 100$ Gauss) in order to orient the tubules along the field axis. Microscopic examination of the samples revealed a high degree of alignment along the rod axis for low loadings of tubules. For the higher loadings ($\geq 30\%$ by weight) the tubule/epoxy composite was highly viscous and the alignment of the tubules was poor. Some clustering and nesting of the tubules were also observed.

2) Microwave Measurements

There are several methods for measuring the permittivity and permeability of the samples at microwave frequencies. The most common is the method of cavity perturbation where a small sample is inserted in a rectangular microwave resonance cavity at the position where the electric or magnetic field is a maximum (antinode). A dielectric sample alters the effective dimensions of the cavity and hence shifts its resonance frequency by $\Delta f$. This frequency shift is related to the real part of the dielectric constant of the specimen through the relation, $$\frac{\Delta f}{f} = 2(\epsilon_R - 1)\frac{V_s}{V_c}. \quad (23)$$

The change in the Q of the cavity is caused by losses due to the sample and is associated with the imaginary part of the dielectric constant through the relation, $$\Delta\left(\frac{1}{Q}\right) = 4\epsilon_I \frac{V_s}{V_c}. \quad 24$$

In these equations, $V_s$ refers to the sample volume and $V_c$ designates the cavity volume.

Another microwave technique known as the "post-in-waveguide" method is useful for determination of permittivities of filamentary samples. The technique is specially suitable for samples with large dielectric constants or high losses. In fact, for this method to work, samples must present a sufficient impedance mismatch to the waveguide to affect the reflection and transmission coefficients in a measurable way. The same rod-shaped samples are used as above, inserted into the sample chamber through a small hole drilled in the waveguide. The data analysis consists of computing the complex transmission and reflection coefficients (the S-parameters) for the post geometry using a T shaped equivalent impedance network.

The cavity measurement setup was simple, consisting of a microwave source (a Hewlett Packard 8341A microwave synthesized sweeper), a waveguide fixture and a detector (Pacific Measurements 1038-N10 Network Analyzer). The waveguide fixture consisted of a coax-to-waveguide adapter, an isolator (to prevent standing waves in the waveguide), a directional coupler (to tap off the microwave signal reflected from the cavity) and a rectangular $TE_{103}$ mode cavity with a variable coupling to the waveguide. In operation the synthesizer was swept through the cavity resonance and the signal was detected by a diode attached to the network analyzer. The center frequency and frequency half width were determined by a processing digital oscilloscope, and passed to an IBM XT computer. The complex permittivity was then calculated.

Post-in-waveguide measurements were carried out by attaching a straight section of waveguide to a Hewlett Packard 8510 Vector Network Analyzer. The complex S-parameters versus frequency were then processed on a VAX computer to yield the permittivity of the sample versus frequency.

The principal sources of error in these measurements were in the determination of sample volume (arising from irregularities introduced in the casting process), and in establishing the tubule weight fraction. The size of the error is indicated by the spread in the experimental points in FIGS. 1 and 3.

Figure 1:
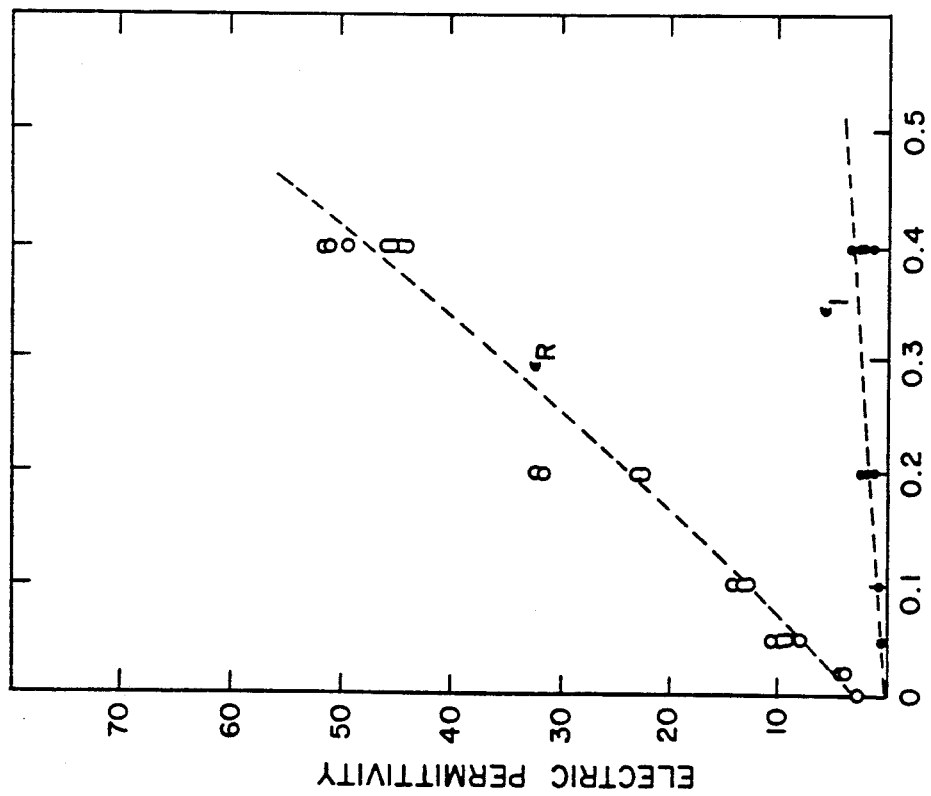
FIG. 1 is a graph showing the real and imaginary parts of electric permittivity vs. tubule-epoxy weight fraction. Measurements were made on rod samples in a microwave resonance cavity. The electric field is along the tubule axes. Multiple data points at the same weight fraction are both for measurements of different samples and for measurements at different locations along the length of a particular rod sample.

Several such measurements were made on our rod specimens at a frequency of 9.5 GHz. In FIG. 1, $\epsilon_R$ and $\epsilon_I$ determined by the cavity perturbation technique are shown at several tubule/epoxy weight fractions. These measurements show a nearly linear relation between the permittivity values and the loading fraction.

The theoretical values of $\epsilon$ as calculated from Equations (16) and (17) depend on the choice of several parameters. These parameters are the radiation frequency, tubule length and radius, tubule conductivity, tubule loading fraction, and the medium's dielectric constant. While most of these parameters are known or easily measurable, two parameters present special problems. One is the tubule length which spans a wide range and the other is the conductivity of the metal coating.

The length distribution of the tubules has been previously studied and reported in Georger et al, J. Am. Chem. Soc. 109, 6169 (1987), the entirety of which is incorporated herein by reference. Using this length distribution, one can calculate the contributions of the tubules to the bulk permittivity weighted according to their statistical distribution in out specimens.

The conductivity of the thin metal coating is hard to measure directly. Several attempts at a direct measurement of resistivity on a single tubule were unsuccessful. However, measurements were made of the resistivity of electrolessly deposited copper microstrips. These lithographically defined metal strips, still much larger than the tubules, typically 20–80 $\mu$m wide, 800 $\mu$m long, and about 0.1 $\mu$m thick, were coated onto substrates by using an electroless process similar to that employed to metallize the tubules. Microprobes, observed under a microscope, were used to determine the resistance of the thin strips of copper as a function of length. The measurements on these metal strips gave a conductivity of about $10^5$/ohm-meter (i.e. about 50-fold lower than the bulk value for copper). The conductivity was observed to deteriorate in time, presumably due to corrosion.

In FIG. 2, we show the calculated values of $\epsilon_R$ and $\epsilon_I$ for several loading fractions. Since all the parameters except conductivity are known, the conductivity $\sigma$ could be used as an adjustable parameter to fit the experimental data. However, we note in passing that once $\sigma$ is chosen, $\epsilon_R$ and $\epsilon_I$ are both determined. This fact provides a severe test of the consistency of the theory. A comparison of FIG. 2 with FIG. 1 shows that the theory accounts reasonably well for the experimental results, with $\sigma = 7.5 \times 10^3$/ohm-meter (which is about 200-fold lower than the value for bulk permalloy).

No attempt was made to measure the magnetic permeability of the rod specimens as the cavity resonance frequency of 9.5 GHz is too high to elicit a magnetic response from permalloy.

Figure 3:
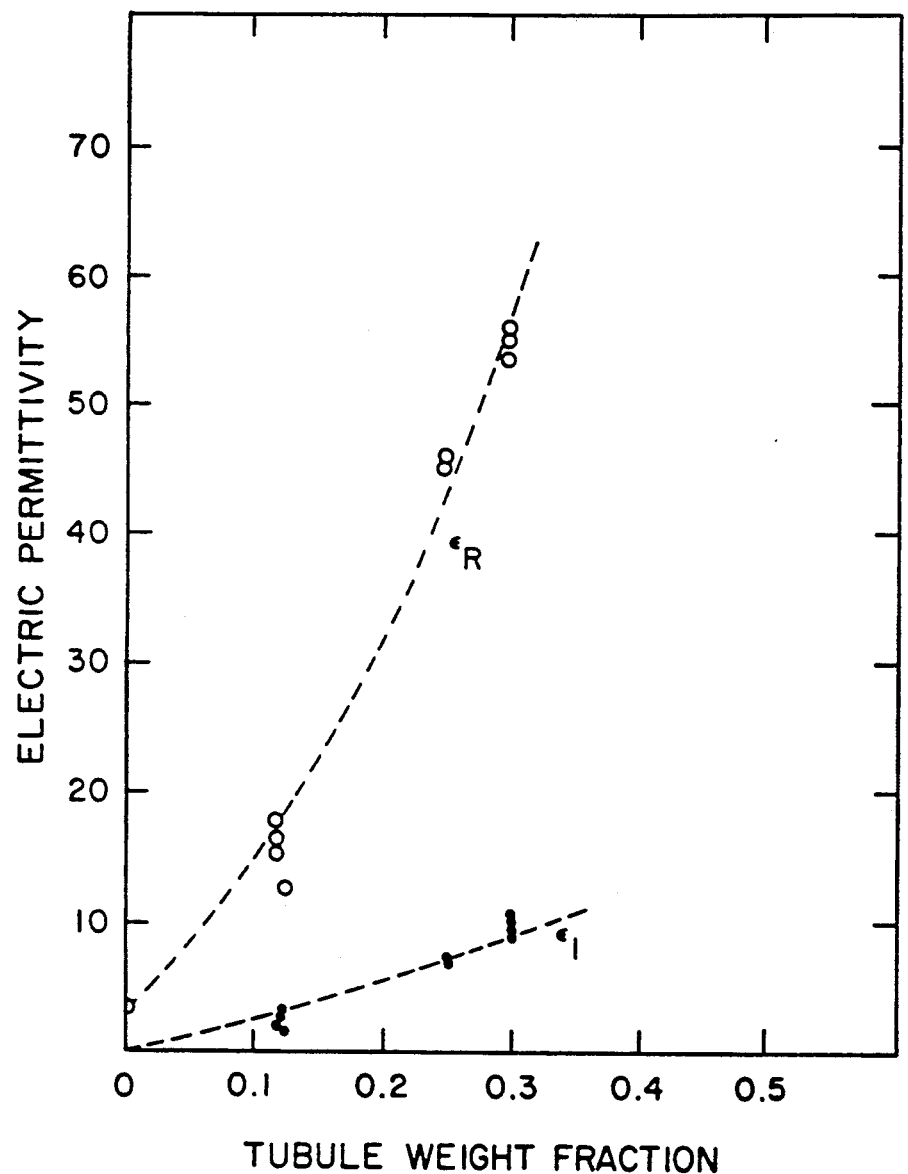
FIG. 3 is a graph of real and imaginary parts of permittivity vs. tubule epoxy weight fraction. The measurements were made on rod samples placed in a microwave rectangular guide (post-in-waveguide). Multiple data points at the same weight fraction are both for measurements of different samples and for measurements at different locations along the length of a particular rod sample.

The results of the post-in-waveguide experiments appear in FIG. 3. The permittivity values for the samples with the higher tubule loadings are somewhat higher than the values measured by the cavity resonance techniques. The reason for this discrepancy is that the cavity method is most accurate for low loss, low dielectric samples that do not destroy the resonance condition. Consequently, the cavity technique is ill suited for lossy samples as the measurement is only possible by greatly increasing the coupling between the cavity and the waveguide. Therefore, the post-in-waveguide technique is more reliable for samples with high losses or a high dielectric constant. Similarly, the low loss, low dielectric samples are most reliably measured in a cavity.

3) Capacitive Measurement

A simple and direct way of measuring the dielectric constant of the tubule-epoxy composite is to measure the capacitance of a parallel plate capacitor with the sample serving as the dielectric medium. A commercial capacitance bridge was used to measure the capacitance of a well isolated parallel plate capacitor consisting of a sheet of tubule-epoxy composite sandwiched between two conducting sheets of aluminum foils and held together by teflon cap plates. At a frequency of 100 KHz, the results show a dielectric constant of $\epsilon_R \sim 7$ and a loss tangent ($\epsilon_I/\epsilon_R$) of about 0.02. At higher frequencies the loss tangent increased, as expected from theory, having the value 0.03 at a frequency of 1 MHz.

The flow casting process aligns the tubules randomly in the plane of the sheets. So in the capacitance measurement, the field E is nearly always perpendicular to the tubule. The measurement thus reflects mainly the dielectric constant of the epoxy matrix, which has been measured to be about 3.

4) RF Measurement

To measure the magnetic permeability of the samples, a simple LRC circuit was devised with the sample serving as the core of the inductor. The inductor was made of 840 turns of copper wire (GW gauge 40) with a turn density of 320/cm. The resonance frequency of an LRC circuit is given by $$f_0 = \frac{1}{2\pi} \sqrt{1/L_0 C} .$$

whence, $$L_0 = \frac{1}{4\pi^2 f_0^2 C} ,$$

and therefore, $$\frac{L}{L_0} = \frac{\mu}{\mu_0} = \left(\frac{f_0}{f}\right)^2 .$$

In these equations, $L_0$ and $f_0$ are the inductance and frequency of the empty coil, L and f are the inductance and frequency of the coil with sample. The resonance frequency was determined with and without the sample in the core and the relative permeability was calculated to be $\mu/\mu_0 = 1.3$ for the 30% loaded sample. Since this weight loading corresponds to a volume loading of about 10% the intrinsic permeability of the tubules is about 4. Bulk permalloy has a permeability larger by 2 to 3 orders of magnitude.

Metallized tubules with large aspect ratios present a rare opportunity for creation of novel materials with extremely anisotropic electromagnetic properties. Classical electrodynamics appears to account well for the observed data on a dilute dispersion of tubules. The highest tubule/epoxy weight fraction in our experimental samples was 0.4, which translates to a volume fraction of 0.15. A higher loading fraction produces a tubule-epoxy paste which does not flow well and is hard to mold. Different prepolymer solutions or ceramic sol-gels may permit higher loading fractions.

The theoretical treatment assumes no tubule-tubule interaction and thus is only valid for dilute composites. Further, the theory is based on the assumption that the wavelength of the radiation is large compared with the tubule dimensions, i.e., the entire tubule sees the same field. This assumption is certainly valid at microwave frequencies, but breaks down when the wavelength of radiation becomes comparable to tubule length.

With these factors in mind, one can design the tubule-epoxy composite to possess certain desirable properties. For example, to reduce the dielectric losses one needs to increase the conductivity of the coating. All other parameters being equal, a tenfold increase in conductivity reduces $\epsilon_I$ by a factor of ten, but leaves $\epsilon_R$ unaffected. Thus, the loss ratio $\epsilon_I/\epsilon_R$ is reduced by a factor of ten.

The theoretical values of $\epsilon_R$ and $\epsilon_I$ shown in FIG. 2 were calculated assuming a conductivity of $7.5 \times 10^3$ mho/m. Bulk metallic conductivities are typically two to three orders of magnitude larger. Consequently, if the conductivity of the metal coating on the tubules were to approach bulk values, the dielectric losses could be cut by as much as two or three orders of magnitude.

Such a dielectric medium with very low losses and a large anisotropic dielectric constant has great promise in technological applications, for instance in the development of capacitors, and waveguides. Further, the tubule-epoxy composite is predicted to maintain its high dielectric constant at frequencies as high as 100 GHz. Though the loss ratio increases linearly with frequency, the real part of the dielectric constant remains essentially unaffected. This proves to be a real virtue compared with many currently available dielectrics which quickly lose their large permittivities as the frequency is increased beyond $10^8$ Hz. The reason is that molecular dipoles are the source of high permittivity in common dielectrics whereas in the tubule system, one uses the conduction electrons to create charge separation. Electrons respond far more quickly to an external field than molecular dipoles.

Apart from the conductivity of the coating, the tubule length to diameter ratio (aspect ratio) has the most dramatic effect on dielectric properties of the tubule-epoxy composites. According to Eqs. (9), (10), (16) and (17) doubling the tubule length enhances by a factor of about 3, while $\epsilon_I$ increases by a factor of 12, thus increasing the loss ratio by 4. Thus if the theory can be suitably extrapolated, modest increases in the tubule length could dramatically increase the dielectric constant beyond the current value of $\sim 50$, while increases in the metal conductivity could reduce the loss tangent.

These conclusions readily follow from Eqs. (11) and (12). At microwave frequencies $\kappa_I$ is very nearly inversely proportional to $\kappa_I$ and thus inversely proportional to $\sigma$. This results in $\epsilon_I$ being inversely proportional to $\sigma$. Similarly, longer tubules with enhanced aspect ratios decrease the value of the depolarization factor L, which in turn has a more dramatic effect on $\alpha_I$ than on $\alpha_R$ as is again evident from Eqs. (1) and (12).

Obviously, many modifications and variations of the present invention are possible in light of the above teachings. It is therefore to be understood that, within the scope of the appended claims, the invention may be practiced otherwise than as specifically described.

What is claimed is:

1. A dielectric composite produced by a method comprising the steps of:
   preparing a mixture of metallized lipid tubules and ceramic sol-gel; and
   sintering said mixture of said tubules and said sol-gel while subjecting said mixture to an electric, magnetic or flow field of sufficient magnitude to align said tubules along said field.

2. An electronic device having a first component with electromagnetic properties and at least one other component, wherein said first component is produced by a method comprising the steps of:
   preparing a mixture of metallized lipid tubules and a prepolymer or sol-gel; and
   curing said mixture of said tubules and said prepolymer or sintering said mixture of said tubules and said sol-gel while subjecting said mixture to an electric, magnetic or flow field of sufficient magnitude to align said tubules along said field.

3. The electronic device of claim 2, wherein 90% or more of the tubules are aligned within 5° of the direction of the field at their location during alignment.

4. The electronic device of claim 3, wherein 90% or more of the tubules are aligned within 2° of the direction of the field at their location during alignment.

5. The electronic device of claim 2, wherein said tubules have an aspect ratio of greater than 20.

6. The electronic component of claim 5, wherein said tubules have an aspect ratio of greater than 50.

7. The electronic device of claim 6, wherein said tubules have as aspect ratio of greater than 150.

8. The electronic device of claim 2, wherein said tubules are subjected to said field while mixed with a prepolymer.

9. The electronic device of claim 8, wherein the lipid tubules comprise about 0.5 to about 50 weight percent of the combined weight of said tubule and said prepolymer.

10. The electronic device of claim 9, wherein the lipid tubules comprise about 0.5 to about 30 weight percent of the combined weight of said tubule and said prepolymer.

11. The electronic device of claim 2, wherein said metallization on said tubules is selected from the group consisting of gold, iron, copper, permalloy, nickel, and a layered alloy of gold on nickel.

12. The electronic device of claim 2, wherein said tubules are aligned in an electric field.

13. The electronic device of claim 2, wherein the tubules are aligned in a magnetic field.

14. The electronic device of claim 2, wherein said tubules are aligned in a flow field.

15. The electronic device of claim 2, wherein said first component is a spatially or frequency tunable filter lens or filter.

16. The electronic device of claim 15, wherein said first component is a spatially or frequency tunable filter.

17. The electronic device of claim 15, wherein said first component is a spatially or frequency tunable lens.

18. The electronic device of claim 2, wherein said first component is an electromagnetic shield.

19. The electronic device of claim 2, wherein said first component is variable phase shifter.

20. The electronic device of claim 2, wherein said device includes a tuned circuit and said first component is an RC resonator for said tuned circuit.

21. A method for the production of a dielectric composite, comprising the steps of:
   preparing a mixture of metallized lipid tubules and ceramic sol-gel; and
   sintering said mixture of said tubules and said sol-gel while subjecting said mixture to an electric, magnetic or flow field of sufficient magnitude to align said tubules along said field.

22. The method of claim 21, wherein 90% or more of the tubules are aligned within 5° of the direction of the field at their location during alignment.

23. The method of claim 22, wherein 90% or more of the tubules are aligned within 2° of the direction of the field at their location during alignment.

24. The method of claim 21, wherein said tubules have an aspect ratio of greater than 20.

25. The method of claim 21, wherein said tubules are aligned in an electric field.

26. The method of claim 21, wherein said tubules are aligned in a magnetic field.

27. The method of claim 21, wherein said tubules are aligned in a flow field.

* * * * *